United States Patent
Yang et al.

(10) Patent No.: US 8,964,485 B2
(45) Date of Patent: Feb. 24, 2015

(54) MEMORY CIRCUIT WITH TRANSISTORS HAVING DIFFERENT THRESHOLD VOLTAGES AND METHOD OF OPERATING THE MEMORY CIRCUIT

(71) Applicant: Taiwan Semiconductor Manufacturing Company, Ltd., Hsinchu (TW)

(72) Inventors: Chou-Ying Yang, Hsinchu (TW); Yi-Cheng Huang, Hsinchu (TW); Shang-Hsuan Liu, Zhudong Town (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 123 days.

(21) Appl. No.: 13/681,030

(22) Filed: Nov. 19, 2012

(65) Prior Publication Data

US 2014/0140143 A1 May 22, 2014

(51) Int. Cl.
  G11C 7/00 (2006.01)
  G11C 7/06 (2006.01)
  G11C 7/10 (2006.01)

(52) U.S. Cl.
  CPC ............. *G11C 7/06* (2013.01); *G11C 7/1048* (2013.01)
  USPC ............ 365/189.02; 365/189.03; 365/189.05; 365/185.07; 365/205; 365/207

(58) Field of Classification Search
  CPC ... G11C 16/3418; G11C 16/0483; G11C 6/10
  USPC ............. 365/189.02, 189.03, 189.05, 185.07, 365/205, 207
  IPC ............................ G11C 16/3418, 16/0483, 6/10
  See application file for complete search history.

(56) References Cited

U.S. PATENT DOCUMENTS

| | | | | |
|---|---|---|---|---|
| 5,936,888 | A * | 8/1999 | Sugawara | .................... 365/185.2 |
| 6,018,487 | A * | 1/2000 | Lee et al. | ........................ 365/204 |
| 6,061,278 | A | 5/2000 | Kato et al. | |
| 6,282,114 | B1 * | 8/2001 | Hanriat et al. | ................ 365/103 |
| 6,490,199 | B2 | 12/2002 | Lee et al. | |
| 7,212,458 | B1 * | 5/2007 | Takeda | .......................... 365/204 |
| 8,050,104 | B2 | 11/2011 | Byeon | |
| 2006/0023535 | A1 | 2/2006 | Chun et al. | |
| 2011/0090745 | A1 | 4/2011 | La Rosa | |

FOREIGN PATENT DOCUMENTS

| | | |
|---|---|---|
| KR | 1999-0062537 | 7/1999 |
| KR | 10-2006-0005626 | 1/2006 |
| KR | 20080065346 | 7/2008 |

OTHER PUBLICATIONS

Notice of Allowance dated Nov. 24, 2014 from corresponding application No. KR 10-2013-016791.

* cited by examiner

*Primary Examiner* — Connie Yoha
(74) *Attorney, Agent, or Firm* — Lowe Hauptman & Ham, LLP

(57) ABSTRACT

A memory circuit includes a memory cell, a data line coupled to the memory cell, a sense amplifier having an input terminal, a precharge circuit coupled to the input terminal of the sense amplifier, a first transistor of a first type, and a second transistor of the first type. The first transistor is coupled between the input terminal of the sense amplifier and the data line, and the second transistor is coupled between to the input terminal of the sense amplifier and the data line. The first transistor has a first threshold voltage, and the second transistor has a second threshold voltage lower than the first threshold voltage.

20 Claims, 5 Drawing Sheets

MEMORY CIRCUIT WITH TRANSISTORS HAVING DIFFERENT THRESHOLD VOLTAGES AND METHOD OF OPERATING THE MEMORY CIRCUIT

BACKGROUND

In a typical memory circuit, a column of memory cells are connected to a bit line, which is in turn connected to a sense amplifier. When performing a read operation on a target memory cell of the column of memory cells corresponding to a predetermined address, the bit line is charged to a predetermined voltage level (also known as a "precharge phase" of a read operation), and then the memory cell is coupled to the bit line in order to change a voltage level of the bit line in response to the datum stored in the memory cell (also known as an "evaluation phase" of a read operation). The sense amplifier then converts the voltage level on the bit line to either a logic 1 output or a logic 0 output (also known as an "output phase" of a read operation). Therefore, the time for performing a read operation is determined by many factors including, among other things, the time required to charge the bit line to the predetermined voltage level.

DESCRIPTION OF THE DRAWINGS

One or more embodiments are illustrated by way of example, and not by limitation, in the figures of the accompanying drawings, wherein elements having the same reference numeral designations represent like elements throughout and wherein.

DETAILED DESCRIPTION

Figure 1:
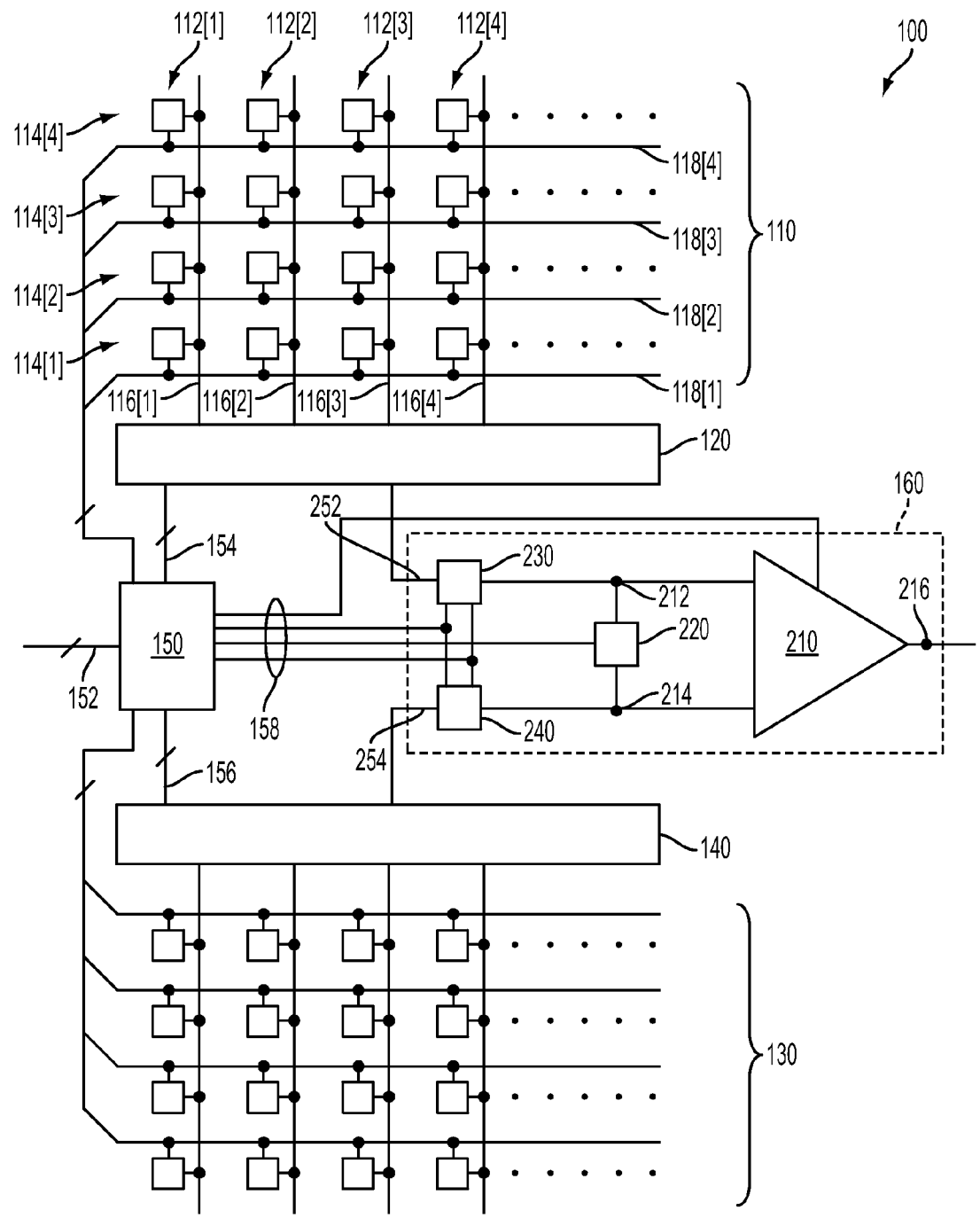
FIG. 1 is a system block diagram of a portion of a memory circuit in accordance with one or more embodiments.

It is understood that the following disclosure provides one or more different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

Moreover, spatially relative terms, for example, "lower," "upper," "horizontal," "vertical," "above," "below," "up," "down," "top," "bottom," "left," "right," etc. as well as derivatives thereof (e.g., "horizontally," "downwardly," "upwardly," etc.), are used for ease of the present disclosure of the relationship of features. The spatially relative terms are intended to cover different orientations of the device including the features.

FIG. 1 is a system block diagram of a portion of a memory circuit 100 in accordance with one or more embodiments. The memory circuit 100 includes a first memory array 110, a first multiplexer 120 connected with the first memory array, a second memory array 130, a second multiplexer 140 connected with the second memory array, a memory control circuit 150, and a sensing unit 160.

The first memory array 110 includes a plurality of memory cells arranged into columns 112[1], 112[2], 112[3], and 112[4] of memory cells and rows 114[1], 114[2], 114[3], and 114[4] of memory cells. Although only four columns of memory cells and four rows of memory cells are depicted in FIG. 1, in some embodiments, the first memory array 110 has memory cells arranged to have more or less than four columns and more or less than four rows. In some embodiments, the memory cells of the memory array 110 are arranged into 256 to 8192 columns and 128 to 4096 rows.

Memory cells of the same column are connected to a common bit line. For example, memory cells of columns 112[1], 112[2], 112[3], and 112[4] are respectively connected to bit lines 116[1], 116[2], 116[3], and 116[4]. Memory cells of the same row are connected to a common word line. For example, memory cells of rows 114[1], 114[2], 114[3], and 114[4] are respectively connected to word lines 118[1], 118[2], 118[3], and 118[4]. Bit lines 116[1], 116[2], 116[3], and 116[4] of the first memory array are connected to the first multiplexer 120.

The second memory array 130 and the second multiplexer 140 are arranged to have a similar configuration as the first memory array 110 and the first multiplexer 120. Therefore, detailed description with respect to the second memory array 130 and the second multiplexer 140 are omitted.

In some embodiments, the memory cells of the memory arrays 110 and 130 are volatile memory cells such as dynamic random access memory (DRAM) cells or static random access memory (SRAM) cells. In some embodiments, the memory cells of the memory arrays 110 and 130 are non-volatile memory cells such as read-only memory (ROM) cells, programmable read-only memory (PROM) cells, erasable programmable read only memory (EPROM) cells, Electrically Erasable Programmable Read-Only Memory (EEPROM) cells, or flash memory cells.

Memory control circuit 150 receives address information and commands from an external circuit via bus 152 and controls the word lines 118[1], 118[2], 118[3], and 118[4] of the first memory circuit 110, the word lines of the second memory circuit 130, the first multiplexer 120 via bus 154, the second multiplexer 140 via bus 156, and the sensing unit 160 via a plurality of control signal lines 158. In some embodiments, the memory control circuit 150 receives a read command and a target address from bus 152. The memory control circuit 150 decodes the target address to select a corresponding memory cell by activating one of the word lines and selecting one of the bit lines by the multiplexer 120 or 140.

Sensing unit 160 includes a sense amplifier 210, a precharge circuit 220, a first switching circuit 230, and a second switching circuit 240. The sense amplifier 210 is a differential mode amplifier having a first input terminal 212, a second input terminal 214, and an output terminal 216. The precharge circuit 220 is coupled to the first input terminal 212 and the second input terminal 214 of the sense amplifier 210. The first switching circuit 230 is coupled between a first data line 252 and the first input terminal 212, and the second switching circuit 240 is coupled between a second data line 254 and the second input terminal 214.

The first data line 252 is connected with the first multiplexer 120, and the second data line 254 is connected with the second multiplexer 140. The first multiplexer 120 connects one of the bit lines 116[1], 116[2], 116[3], and 116[4] to the first data line 252 and disconnects the other ones of the bit lines 116[1], 116[2], 116[3], and 116[4] from the first data line 252 in response to a control signal from the memory control circuit 150. The second multiplexer 140 connects one of the bit lines of the second memory array 130 to the second data line 254 and disconnects the other ones of the bit lines of the second memory array 130 from the second data line 254 in response to another control signal from the memory control circuit 150.

In some embodiments, when the read operation of the memory circuit 100 is for reading a target memory cell in the first memory array 110, a corresponding one of the word lines 118[1], 118[2], 118[3], and 118[4] is selected, and a corresponding one of the bit lines 116[1], 116[2], 116[3], and 116[4] is connected to the first data line 252 via the first multiplexer 120. Meanwhile, because the sense amplifier 210 is a differential mode amplifier, the second memory array 130 and the second multiplexer 140 are configured to provide a reference voltage or a reference current at the second data line 254. The signals on the first data line 252 and the second data line 254 are transferred to the first and second input terminals 212 and 214 through the first and second switching circuits 230 and 240. The sense amplifier 210 then generates an output signal at the output terminal 216 based on the voltage difference or current difference at the first and second input terminals 212 and 214.

Figure 2:
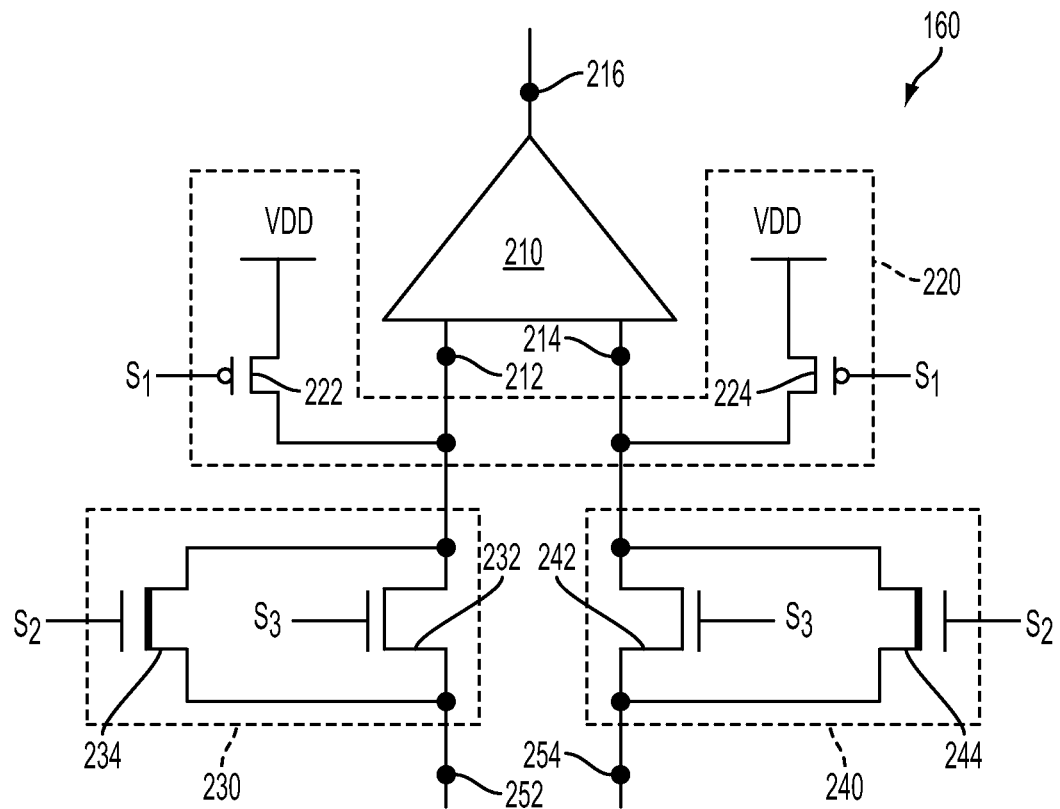
FIG. 2 is a circuit diagram of an example sensing unit of a memory circuit in accordance with one or more embodiments.

FIG. 2 is a circuit diagram of an example sensing unit 160 of the memory circuit 100 in accordance with one or more embodiments. The precharge circuit 220 includes a first P-channel transistor 222 and a second P-channel transistor 224. In the embodiment depicted in FIG. 2, the P-channel transistors 222 and 224 are P-type metal-oxide semiconductor field effect transistors (PMOS transistors). The source of the first P-channel transistor 222 and the source of the second P-channel transistor 224 are coupled to a precharge voltage supply VDD. The drain of the first P-channel transistor 222 is coupled to the first input terminal 212 of the sense amplifier 210, and the drain of the second P-channel transistor 224 is coupled to the second input terminal 214 of the sense amplifier 210. The gates of the P-channel transistors 222 and 224 are coupled to a first precharge control signal line $S_1$ of the control signal lines 158. The precharge circuit 220 charges the input terminals 212 and 214 of the sense amplifier 210 to a predetermined voltage level Vdd generated by the precharge voltage supply VDD. A person having ordinary skill in the art would appreciate that, in some embodiments, the transistors 222 and 224 are N-channel transistors.

The first switching circuit 230 includes a first N-channel transistor 232 and a second N-channel transistor 234. In the embodiment depicted in FIG. 2, the N-channel transistors 232 and 234 are N-type metal-oxide semiconductor field effect transistors (NMOS transistors). The first N-channel transistor 232 has a drain coupled to the first input terminal 212 of the sense amplifier 210 and a source coupled to the first data line 252, and the second N-channel transistor 234 has a drain coupled to the first input terminal 212 of the sense amplifier 210 and a source coupled to the first data line 252. The first N-channel transistor 232 has a first threshold voltage, and the second N-channel transistor 234 has a second threshold voltage lower than the first threshold voltage. In some embodiments, the second threshold voltage is about 100 mV to 300 mV lower than the first threshold voltage.

The second switching circuit 240 includes a third N-channel transistor 242 and a fourth N-channel transistor 244. In the embodiment depicted in FIG. 2, the N-channel transistors 242 and 244 are also NMOS transistors. The third N-channel transistor 242 has a drain coupled to the second input terminal 214 of the sense amplifier 210 and a source coupled to the second data line 254, and the fourth N-channel transistor 244 has a drain coupled to the second input terminal 214 of the sense amplifier 210 and a source coupled to the second data line 254. The third N-channel transistor 242 has a third threshold voltage, and the fourth N-channel transistor 244 has a fourth threshold voltage lower than the third threshold voltage. In some embodiments, the fourth threshold voltage is about 100 mV to 300 mV lower than the third threshold voltage.

In at least one embodiment, the first N-channel transistor 232 and the third N-channel transistor 242 have substantially the same electrical characteristics, and the second N-channel transistor 234 and the fourth N-channel transistor 244 have substantially the same electrical characteristics. A person having ordinary skill in the art would appreciate that, in some embodiments, the transistors 232, 234, 242, and 244 are P-channel transistors when transistors 222 and 224 are N-channel transistors.

The gates of the second and fourth N-channel transistors 234 and 244 are coupled to a second precharge control signal line $S_2$ of the control signal lines 158, and the gates of the first and third N-channel transistors 232 and 242 are coupled to a connecting control signal line $S_3$ of the control signal lines 158.

In some embodiments, the memory control circuit 150 (FIG. 1) activates the precharge circuit 220 via the first precharge control signal line $S_1$ during a first time period (i.e., the "precharge phase") and deactivates the precharge circuit 220 via the first precharge control signal line $S_1$ during a second time period (i.e., the "evaluation phase") after the first time period. In some embodiments, the memory control circuit 150 also turns on the second and fourth N-channel transistors 234 and 244 via the second precharge control signal line $S_2$ during the first time period. In some embodiments, the memory control circuit 150 turns off the second and fourth N-channel transistors 234 and 244 via the second precharge control signal line $S_2$ during the second time period. In at least one embodiment, the first precharge control signal line $S_1$ carries a control signal that is logically complementary to that of the second precharge control signal line $S_2$.

In some embodiments, the memory control circuit 150 further turns off the first and third N-channel transistors 232 and 242 via the connecting control signal line $S_3$ during the first time period and turns on the first and third N-channel transistors 232 and 242 during the second time period. In some embodiments, the memory control circuit 150 turns on the first and third N-channel transistors 232 and 242 during both the first time period and the second time period.

Figure 3:
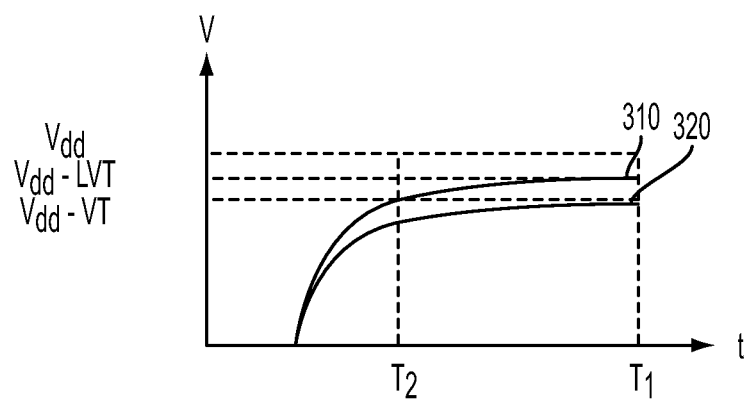
FIG. 3 is a chart of voltage levels of an example data line charged by transistors having different threshold voltages in accordance with one or more embodiments.

FIG. 3 is a chart of voltage levels of an example data line 252 charged by transistors having different threshold voltages, such as the first N-channel transistor 232 and the second N-channel transistor 234, in accordance with one or more embodiments. The operation of the first switching circuit 230 will be further described in detail below. The operation of the second switching circuit 240 is the same as that of the first switching circuit 230, and thus detailed description thereof is omitted.

In the embodiment depicted in FIG. 3, the second precharge control signal line $S_2$ and the connecting control signal line $S_3$ used to turn on/off the N-channel transistors 232 and 234 are at a voltage level equal to the predetermined voltage level Vdd generated by the precharge voltage supply VDD. The first N-channel transistor 232 has a first threshold voltage VT, and the second N-channel transistor 234 has a second threshold voltage LVT lower than the first threshold voltage VT.

During the precharge phase, the first N-channel transistor 232 and the second N-channel transistor 234 are initially operated in a saturation region, which allows a charging current from the precharge circuit 220 to transfer to the first data line 252. When the voltage level at the first data line is increased to a level closer to Vdd-VT for the first N-channel transistor 232 or Vdd-LVT for the second N-channel transistor 234, the operation of the first N-channel transistor 232 and the second N-channel transistor 234 gradually moves from the saturation region to a triode region, which significantly limits the amount of current from the precharge circuit 220 to the first data line 252.

As depicted in FIG. 3, curve 310 represents the voltage level at the first data line 252 when only the second N-channel transistor 234 is turned on during the precharge phase, and curve 320 represents the voltage level at the first data line 252 when only the first N-channel transistor 232 is turned on during the precharge phase. At time $T_1$, the first N-channel transistor 232 is capable of charging the first data line 252 to Vdd-VT, the second N-channel transistor 234 is capable of charging the first data line 252 to Vdd-LVT, and both N-channel transistors 232 and 234 are operated in the triode region with nearly no driving current. Because the second N-channel transistor 234 is configured to have a lower threshold voltage than the first N-channel transistor 232, the second N-channel transistor 234 is capable of providing a greater driving current before entering the triode region. As such, at time $T_2$ prior to time $T_1$, the second N-channel transistor 234 is capable of charging the first data line 252 to the voltage level of Vdd-VT.

Therefore, in some embodiments, to benefit from both the saturation region of the second N-channel transistor 234 and the triode region of the first N-channel transistor 232, the second N-channel transistor 234 is turned on to charge the first data line 252 to Vdd-VT during the precharge phase, and the first N-channel transistor 232 is turned on during the evaluation phase to keep the voltage level of the first data line 252 at Vdd-VT. The control signal needed to turn on the second N-channel transistor 234 need not have a voltage level greater than the predetermined voltage level Vdd. Thus, compared with some other configurations without the second N-channel transistor 234 (having a lower threshold voltage LVT than the first N-channel transistor 232), the control signal on the second precharge control signal line $S_2$ is no greater than the predetermined voltage level Vdd and a level shifter for the second precharge control signal line $S_2$ is omitted in some embodiments.

In at least one embodiment, if the second N-channel transistor 234 is still turned on at the beginning of the evaluation phase, the second N-channel transistor 234 is still operated near the saturation region. The second N-channel transistor 234 thus would allow too large a current that will hinder the distinguishing of a logic 1 signal from a logic 0 signal at the first data line 252. Therefore, in some embodiments, the second N-channel transistor 234 is turned off during the evaluation phase.

Figures 4A, 4B, 4C, 4D:
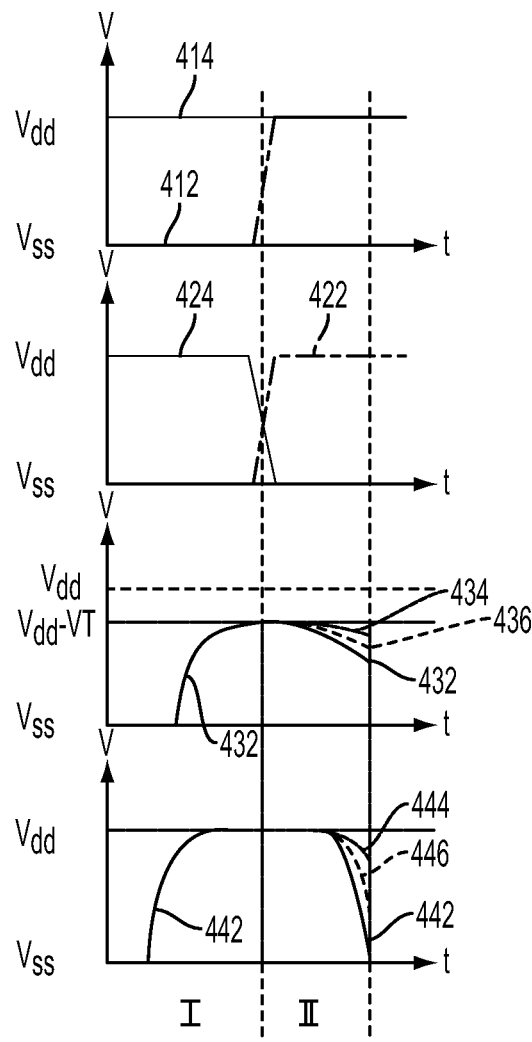
FIG. 4A-4D are charts of voltage levels at various nodes of a sensing unit of a memory circuit in accordance with one or more embodiments.

FIGS. 4A-4D are charts of voltage levels at various nodes of a sensing unit 160 of a memory circuit 100 in accordance with one or more embodiments. Curves 412 and 414 in FIG. 4A represent the voltage level at the connecting control signal line $S_3$ according to two example embodiments. Curves 422 and 424 in FIG. 4B represent the voltage levels at the first precharge control signal line $S_1$ and the second precharge control signal line $S_2$, respectively. Curves 432, 434, and 436 in FIG. 4C represent the voltage level at the first data line 252 when sensing a logic 1 signal, a logic 0 signal, and a reference signal, respectively. Curves 442, 444, and 446 in FIG. 4D represent the voltage level at the first input terminal 212 when sensing a logic 1 signal, a logic 0 signal, and a reference signal, respectively.

During a first time period I (i.e., the precharge phase), the precharge circuit 220 is activated by setting the first precharge control signal line $S_1$ at Vss (curve 422). For example, the transistor 222 is turned on by setting the first precharge control signal line $S_1$ at Vss (curve 422) to pull the voltage level at the first input terminal 212 of the sense amplifier to Vdd (curve 442). The second N-channel transistor 234 is turned on by setting the voltage level of the second precharge control signal line $S_2$ at Vdd (curve 424). As illustrated using FIG. 3, the second N-channel transistor 234, if enabled, pulls the first data line 252 toward Vdd-VT faster than relying solely on the first N-channel transistor 232. In some embodiments, the first N-channel transistor 232 is turned off by setting the connecting control signal $S_3$ at Vss (curve 412) during the precharge phase. In some embodiments, the first N-channel transistor 232 is also turned on by setting the connecting control signal $S_3$ at Vdd (curve 414) to assist the charging of the first data line 252.

During a second time period II (i.e., the evaluation phase), the precharge circuit 220 is deactivated by setting the first precharge control signal line $S_1$ at Vdd (curve 422). The second N-channel transistor 234 is turned off by setting the voltage level of the second precharge control signal line $S_2$ at Vss (curve 424). As illustrated using FIG. 3, the first N-channel transistor 232 is turned on by setting the connecting control signal $S_3$ at Vdd (curve 412 or curve 414) to keep the voltage level of the first data line 252 at Vdd-VT. During the evaluation phase, the first data line 252 is coupled to one of the bit lines via the multiplexer 120 to sense the datum stored in a target memory cell or to receive a reference voltage or reference current from the multiplexer 120. The signal on the bit line coupled to the first data line by the multiplexer 120 in turn discharges the first data line 252 toward Vss at different rates as indicated by curves 432 (reading a logic 1), 434 (reading a logic 0), and 436 (receiving a reference voltage/current).

The first input terminal 212 of the sense amplifier 210 is separated from the first data line 252 by the first N-channel transistor 232. The first N-channel transistor 232, by biasing the gate of the first N-channel transistor 232 at Vdd, functions as a common-base amplifier for the input terminal 212 of the sense amplifier 210. As such, the first N-channel transistor 232 buffers the current drawn by the target memory cell and amplifies the voltage drop at the first data line 252 for the input terminal 212. The resulting voltage levels at the input terminal 212 for sensing a logic 1 signal, a logic 0 signal, or a reference voltage/current are shown in FIG. 4D as depicted by curves 442, 444, and 446, respectively.

Figure 5:
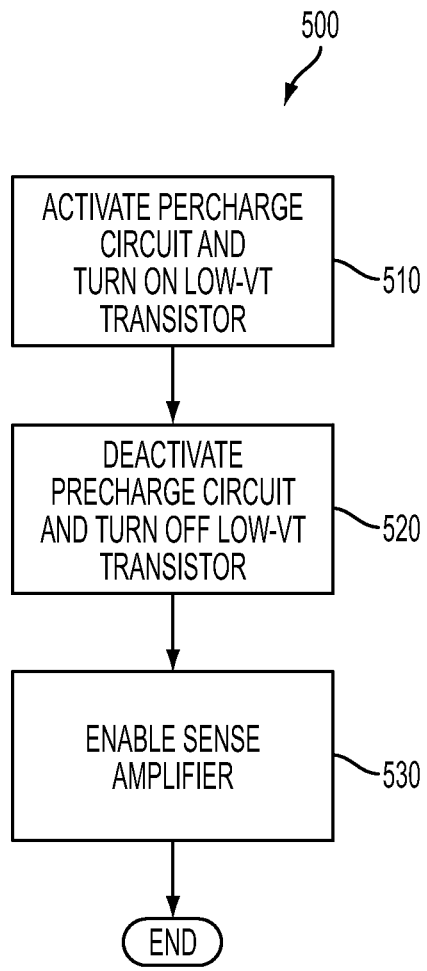
FIG. 5 is a flow chart of a method of operating a sensing unit of a memory circuit in accordance with one or more embodiments.

FIG. 5 is a flow chart of a method 500 of operating a sensing unit 160 of a memory circuit 100 in accordance with one or more embodiments. It is understood that additional processes may be performed before, during, and/or after the method 500 depicted in FIG. 5, and that some other processes may only be briefly described herein.

As depicted in FIG. 5 and FIGS. 2 and 4A-4D, in operation 510, the precharge circuit 220 is activated to charge the first input terminal 212 of the sense amplifier 210 to a predetermined voltage level Vdd during a precharge phase. The second N-channel transistor 234 is turned on during a period the precharge circuit 220 is activated to charge the first data line 252 toward a voltage level equal to the predetermined voltage level Vdd minus the first threshold voltage VT of the first N-channel transistor 232 (Vdd-VT). In some embodiments, the first N-channel transistor 232 is turned off during the period the precharge circuit 220 is activated. In at least one embodiment, the first N-channel transistor 232 is turned on during the period the precharge circuit 220 is activated.

In some embodiments, the precharge circuit 220 is also activated to charge the second data line 254 toward a voltage level equals the predetermined voltage level Vdd minus the third threshold voltage of the third N-channel transistor 242 during operation 510.

The process moves on to operation 520, where the precharge circuit 220 is deactivated after the precharge circuit 220 has been activated for a predetermined period of time. The second N-channel transistor 234 is also turned off during a period the precharge circuit is deactivated. In some embodiments, the first N-channel transistor 232 is turned on during the period the precharge circuit 220 is deactivated. In at least one embodiment, the first N-channel transistor 232 is turned on during both the period the precharge circuit 220 is activated and the period the precharge circuit 220 is deactivated.

In some embodiments, the fourth N-channel transistor 244 is turned off during the period the precharge circuit 220 is deactivated in operation 520.

The process moves on to operation 530, where the sense amplifier 210 is enabled to amplify the voltage level at the first input terminal 212 and/or the voltage level at the second input terminal 214 and output a read data output at the output terminal 216 of the sense amplifier.

Figure 6:
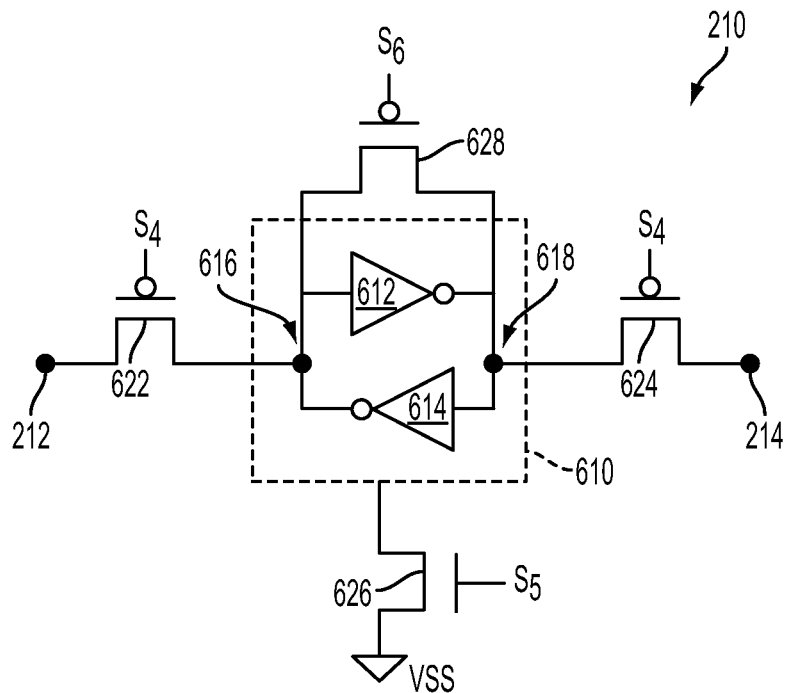
FIG. 6 is a circuit diagram of an example sense amplifier in accordance with one or more embodiments.

FIG. 6 is a circuit diagram of an example sense amplifier 210 in accordance with one or more embodiments. The sense amplifier 210 has a cross-latch circuit 610 including two cross-coupled inverters 612 and 614, a first input/output node 616, and a second input/output node 618. One of the first input/output nodes 616 is coupled to the output terminal 216 (FIG. 1). The sense amplifier 210 also includes transistors 622, 624, 626, and 628. Transistor 622 has drain and source coupled to a corresponding one of the first input/output node 616 and the first input terminal 212, and transistor 624 has drain and source coupled to a corresponding one of the second input/output node 618 and the second input terminal 214. The gates of the transistors 622 and 624 are connected to an isolation control signal line $S_4$ of the control signal lines 158 (FIG. 1). The transistors 622 and 624 are turned on during a third time period (also referred to as the output phase of the read operation) that the sense amplifier 210 is enabled.

Transistor 626 connects or disconnects the cross-latch circuit 610 to or from a power supply VSS in response to a control signal on a sense amplifier enabling line $S_5$ of the control signal lines 158 to enable or disable the sense amplifier 210. Transistor 628 is coupled between the first input/output node 616 and the second input/output node 618. The gate of the transistor 628 is connected to a third precharge control line $S_6$ of the control signal lines 158 to short the first input/output node 616 and the second input/output node 618 during the precharge phase.

Figure 7:
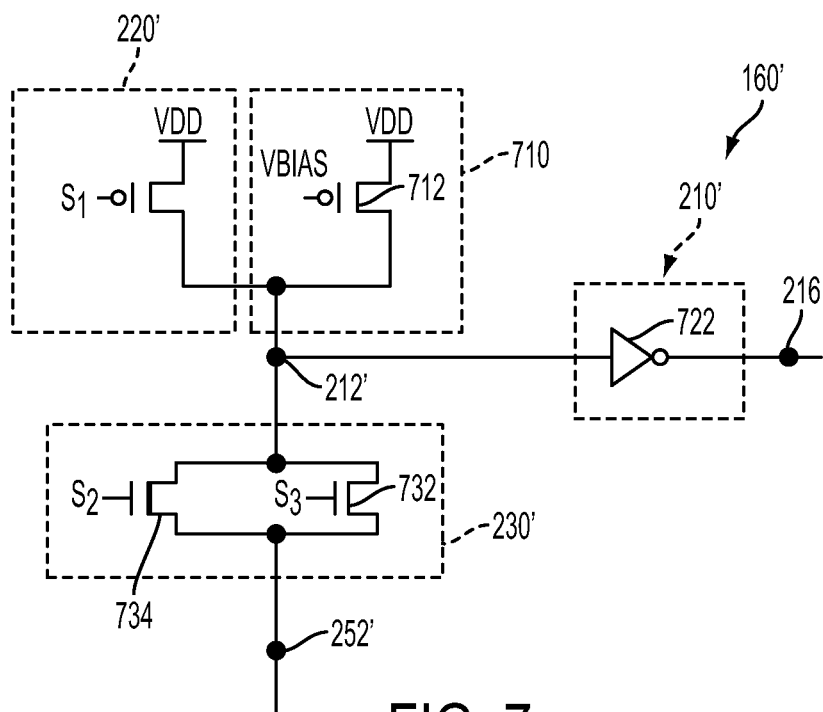
FIG. 7 is a circuit diagram of another example sensing unit of a memory circuit in accordance with one or more embodiments.

FIG. 7 is a circuit diagram of another example sensing unit 160' of a memory circuit 100 in accordance with one or more embodiments. The sensing unit 160' includes a sense amplifier 210', a precharge circuit 220', and a switching circuit 230'. The sensing unit 160 further includes a biasing circuit 710. Compared with the sensing unit 160 depicted in FIG. 2, the sense amplifier 210' has only one input terminal 212'.

The biasing circuit 710 is coupled to the input terminal 212' of the sense amplifier 210'. The biasing circuit 710 has a transistor 712 coupled between the input terminal 212' and a voltage supply, such as the precharge voltage supply VDD. The gate of the transistor 712 is biased at a reference voltage VBIAS to provide a reference current from the voltage supply VDD to the input terminal 212' during the evaluation phase.

The sense amplifier 210' includes an inverter 722. During the evaluation phase, the current driven by the transistor 712 competes with the current drawn by the target memory cell via the switching circuit 230' to pull the voltage level at the input terminal 212' either above or below a trip level of the inverter 722. The inverter 722 amplifies the signal at the input terminal 212' and outputs a read data at the output terminal 216. The precharge circuit 220' pulls the voltage level at the input terminal 212' toward the predetermined voltage level supplied by the precharge voltage supply VDD during the precharge phase. The switching circuit 230' has a first N-channel transistor 732 and a second N-channel transistor 734. The threshold voltage of the second N-channel transistor 734 is lower than that of the first N-channel transistor 732. The operation of the switching circuit 230' is basically the same as the operation illustrated above in conjunction with FIGS. 4A-4B.

In accordance with one embodiment, a memory circuit includes a memory cell, a data line coupled to the memory cell, a sense amplifier having an input terminal, a precharge circuit coupled to the input terminal of the sense amplifier, a first transistor of a first type, and a second transistor of the first type. The first transistor has a drain coupled to the input terminal of the sense amplifier and a source coupled to the data line, and the second transistor has a drain coupled to the input terminal of the sense amplifier and a source coupled to the data line. The first transistor has a first threshold voltage, and the second transistor has a second threshold voltage lower than the first threshold voltage.

In accordance with another embodiment, a circuit includes a data line, a sense amplifier having an input terminal, a precharge circuit, a first transistor, a second transistor, and a control circuit. The precharge circuit charges the input terminal of the sense amplifier to a predetermined voltage level. The first transistor is coupled between the input terminal of the sense amplifier and the data line and has a first threshold voltage. The second transistor is coupled between the input terminal of the sense amplifier and the data line and has a second threshold voltage lower than the first threshold voltage. The control circuit turns on the second transistor by a control signal having a voltage level no greater than the predetermined voltage level.

In accordance with another embodiment, a circuit includes a sense amplifier, a precharge circuit coupled to the sense amplifier, a first transistor having a first threshold voltage and coupled between an input terminal of the sense amplifier and a data line, and a second transistor having a second threshold voltage lower than the first threshold voltage and coupled between the input terminal of the sense amplifier and the data line. A method of operating the circuit includes activating the precharge circuit to charge the input terminal of the sense amplifier to a predetermined voltage level. The second transistor is turned on during a period the precharge circuit is activated to charge the data line toward a voltage level equal to the predetermined voltage level minus the first threshold voltage of the first transistor. Then the sense amplifier is enabled.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit comprising:
a memory cell;
a data line coupled to the memory cell;
a sense amplifier having an input terminal;
a precharge circuit coupled to the input terminal of the sense amplifier;
a first transistor of a first type having a drain coupled to the input terminal of the sense amplifier and a source coupled to the data line, the first transistor having a first threshold voltage; and
a second transistor of the first type having a drain coupled to the input terminal of the sense amplifier and a source coupled to the data line, the second transistor having a second threshold voltage lower than the first threshold voltage.

2. The memory circuit of claim 1, wherein the first transistor and the second transistor are N-channel transistors.

3. The memory circuit of claim 1, further comprising:
a bit line connected with the memory cell; and
a multiplexer between the bit line and the data line and configured to disconnect the bit line from the data line in response to a control signal.

4. The memory circuit of claim 1, further comprising:
a memory control circuit configured to:
activate the precharge circuit during a first time period and deactivate the precharge circuit during a second time period after the first time period; and
turn on the second transistor during the first time period.

5. The memory circuit of claim 4, wherein the memory control circuit is further configured to turn off the second transistor during the second time period.

6. The memory circuit of claim 4, wherein the memory control circuit is further configured to turn on the first transistor during the second time period.

7. The memory circuit of claim 4, wherein the memory control circuit is further configured to turn on the first transistor during the first time period and the second time period.

8. The memory circuit of claim 1, wherein the precharge circuit comprises a transistor of a second type having a drain coupled to a precharge voltage supply and a source coupled to the input terminal of the sense amplifier.

9. The memory circuit of claim 8, wherein the transistor of the second type is a P-channel transistor.

10. The memory circuit of claim 1, wherein the sense amplifier has another input terminal, and the memory circuit further comprises:
another memory cell;
another data line coupled to the another memory cell;
a third transistor of the first type having a drain coupled to the another input terminal of the sense amplifier and a source coupled to the another data line, the third transistor having a third threshold voltage; and
a fourth transistor of the first type having a drain coupled to the another input terminal of the sense amplifier and a source coupled to the another data line, the fourth transistor having a fourth threshold voltage lower than the second threshold voltage.

11. A circuit comprising:
a data line;
a sense amplifier having an input terminal;
a precharge circuit configured to charge the input terminal of the sense amplifier to a predetermined voltage level;
a first transistor coupled between the input terminal of the sense amplifier and the data line, the first transistor having a first threshold voltage;
a second transistor coupled between the input terminal of the sense amplifier and the data line, the second transistor having a second threshold voltage lower than the first threshold voltage; and
a control circuit configured to turn on the second transistor by a control signal having a voltage level no greater than the predetermined voltage level.

12. The circuit of claim 11, wherein the control circuit is further configured to:
activate the precharge circuit during a first time period and deactivate the precharge circuit during a second time period after the first time period;
turn on the second transistor during the first time period; and
turn off the second transistor during the second time period.

13. The circuit of claim 12, wherein the control circuit is further configured to turn on the first transistor during the second time period.

14. The circuit of claim 12, wherein the control circuit is further configured to turn on the first transistor during the first time period and the second time period.

15. The circuit of claim 11, wherein the first transistor and the second transistor are N-channel transistors.

16. A method of operating a circuit comprising a sense amplifier, a precharge circuit coupled to the sense amplifier, a first transistor having a first threshold voltage and coupled to a corresponding one of an input terminal of the sense amplifier and a data line, and a second transistor having a second threshold voltage lower than the first threshold voltage and coupled between the input terminal of the sense amplifier and the data line, the method comprising:
activating the precharge circuit to charge the input terminal of the sense amplifier to a predetermined voltage level;
turning on the second transistor during a period the precharge circuit is activated to charge the data line toward a voltage level equal to the predetermined voltage level minus the first threshold voltage of the first transistor; and
enabling the sense amplifier.

17. The method of claim 16, further comprising:
deactivating the precharge circuit after the precharge circuit has been activated for a predetermined period of time; and
turning off the second transistor during a period the precharge circuit is deactivated.

18. The method of claim 17, further comprising:
turning on the first transistor during the period the precharge circuit is deactivated.

19. The method of claim 17, further comprising:
turning on the first transistor during the period the precharge circuit is activated and during the period the precharge circuit is deactivated.

20. The method of claim 16, wherein the second transistor is turned on by a control signal having a voltage level no greater than the predetermined voltage level.

* * * * *